United States Patent [19]

Raymond et al.

[11] Patent Number: 4,791,359

[45] Date of Patent: Dec. 13, 1988

[54] METHOD OF DETECTING POSSIBLY ELECTRICALLY-OPEN CONNECTIONS BETWEEN CIRCUIT NODES AND PINS CONNECTED TO THOSE NODES

[75] Inventors: Douglas W. Raymond, Orinda, Calif.; Nicholas Winfield, Towcester, England

[73] Assignee: Zehntel, Inc., Walnut Creek, Calif.

[21] Appl. No.: 122,280

[22] Filed: Nov. 18, 1987

[51] Int. Cl.$^4$ .................... G01R 31/28; G01R 31/02
[52] U.S. Cl. .................................. 324/73 R; 371/20
[58] Field of Search ................... 324/73 R, 73 AT; 371/15, 16, 20, 21, 27

[56] References Cited

U.S. PATENT DOCUMENTS

| | | | |
|---|---|---|---|
| 3,801,905 | 4/1974 | Baker et al. | 324/73 R |
| 4,638,246 | 1/1987 | Blank et al. | 371/21 |
| 4,742,293 | 5/1988 | Koo et al. | 324/73 R |

Primary Examiner—Ernest F. Karlsen
Attorney, Agent, or Firm—Arnold, White & Durkee

[57] ABSTRACT

A method of detecting possibly electrically-open connections between circuit nodes and pins of components physically connected to the nodes. The pins include input pins and output pins, the input pins connected to corresponding input nodes and the output pins connected to corresponding output nodes. The method comprises the steps of determining if the connections between the input pins and the input nodes can be tested, and then testing for an electrically-open connection between each input pin and its corresponding input node. The two-step method of determining if the connections between the input pins and the input nodes can be tested includes a first step of determining if the output nodes exhibit activity in response to application of stimuli to the input nodes, and continuing testing if there is activity. The second step is determining if each output node exhibits a signature repeated identically in response to stimuli repeated identically at all the input nodes. No attempt is made to test the connections between the input pins and their corresponding input nodes unless all the signatures measured at the output nodes are repeatable. Testing for an electrically-open connection between each input pin and its corresponding input node includes the steps of applying a first stimulus to a selected input node while applying a second stimulus to the rest of the input nodes, and then generating a signal indicating a possibly open connection if for any given output node the response is not identical to the response when the second stimulus is applied to all the input nodes.

13 Claims, 1 Drawing Sheet

METHOD OF DETECTING POSSIBLY ELECTRICALLY-OPEN CONNECTIONS BETWEEN CIRCUIT NODES AND PINS CONNECTED TO THOSE NODES

BACKGROUND AND SUMMARY OF THE INVENTION

This invention relates to digital in-circuit testers for testing newly-built printed circuit assemblies. Testers usually have a central processing unit, a test-head controller, one or more driver-receiver cards, and channels. The channels are used to either drive a printed circuit assembly test node or receive a signal from that node, or both drive and receive signals. A small incircuit tester may be equipped with up to about two hundred channels, and can test small boards. Large digital in-circuit testers with more than three thousand channels also exist. Digital in-circuit testers are disclosed in the following patents: U.S. Pat. No. 4,339,819 to Jacobsen; U.S. Pat. No. 4,216,539 to Raymond et al.; U.S. Patent No. 3,943,439 to Raymond; and U.S. Pat. No. 3,931,506 to Borrelli et al. These patents are incorporated herein by reference. Related applications assigned to the Assignee of the present invention are: application Ser. No. 056,583 for "A Digital In-Circuit Tester Having a Channel-Driver Inhibitor", and application Ser. No. 055,736 for a "Digital In-Circuit Tester Having Channel-Memory Erase-Preventer. Preventer."

The assignee of the present invention makes incircuit testers which identify manufacturing defects such as wrong-value passive and non-functioning actives, including logic integrated circuits. The part of an incircuit tester that tests for correct operation of logic integrated circuits is based on Gray code and signature "analysis". However, no "analysis" is performed beyond matching of an observed signature to one previously recorded. In a digital integrated circuit test, a burst of Gray code stimuli are applied to devices' inputs and signatures are tested on the devices' outputs A "signature" is a compressed representation of a sequence of logic "highs" and "lows". The past practice has been that if an incorrect signature (i.e., one that does not match a stored value) is observed at one of the outputs of the integrated circuit, the integrated circuit is rejected. No further investigation takes place. However, users of these testers have recently stated that they would like to know which pin or pins are "open" if the rejection is due to an open pin of the surface-mounted device. An "open" pin is a pin which is not electrically connected to its corresponding node on the printed circuit board.

In the past the information as to which pin was "open" was not as important, since circuit boards were assembled from large numbers of cheap integrated circuits with through-the-hole leads. However, identification of the "open pin" has become more important as more boards are being manufactured using surface-mounted integrated circuits or other surface-mounted electronic components.

A through-the-hole integrated circuit is inexpensive to replace and usually must be replaced anyway if one of its pins is "open," since this "open" state is usually due to the pin having been crumpled during installation. In contrast, a surface-mounted integrated circuit is expensive to replace and has no pins to crumple. Thus, the "open pin" problem for a surface-mounted component can usually be solved by touching up solder on the open pin of the surface-mounted component.

The method of the present invention is particularly applicable to a digital in-circuit tester having a small central processing unit, because the method of the present invention does not require a "fault dictionary." The "fault dictionary" approach, well-known in the field of automatic test equipment, generally requires a large amount of additional memory. In contrast, the method of the present invention requires very little additional memory in the tester.

BRIEF DESCRIPTION OF THE DRAWING

The above-noted and other aspects of the present invention will become more apparent from a description of the preferred method when read in conjunction with the accompanying flowchart of FIG. 1.

DESCRIPTION OF THE PREFERRED METHOD

Figure 1:
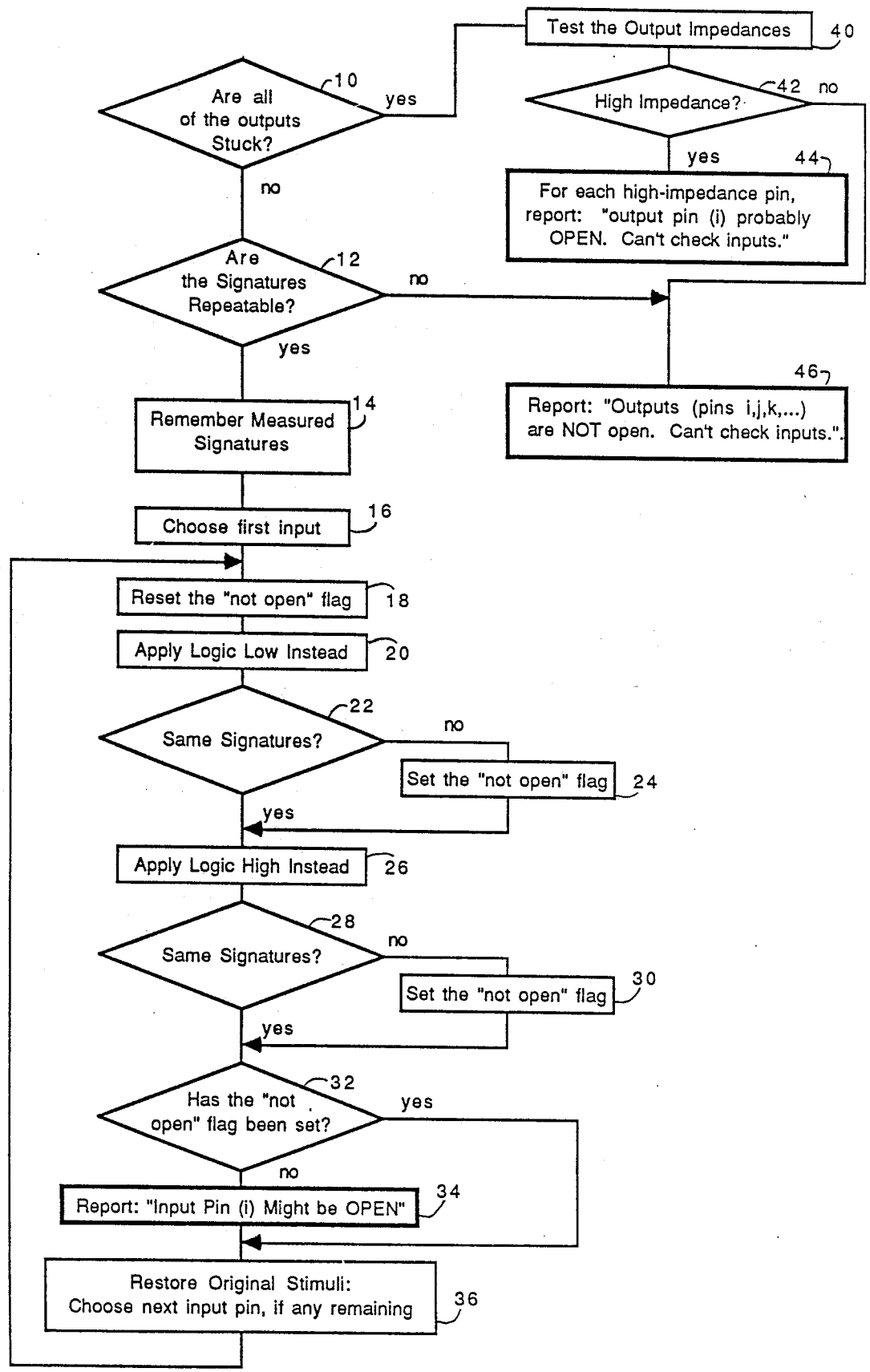
FIG. 1 illustrates the steps of the method of the present invention.

FIG. 1 illustrates the method of the present invention for detecting possibly electrically open connections between circuit nodes and pins of a component physically connected to those same nodes. Steps 10-36 of the method are for checking the connection between the input pins and their corresponding input nodes and Steps 40-46 are for checking the connection between the output pins and their corresponding output nodes. Obviously, there is no need to check for such "open" connections unless the tester detects an incorrect output signature at a given output node. To begin the testing of a selected component, the tester first determines if the connections between the input pins and the input nodes should be tested.

To make such determination, the tester answers the question shown in the box representing step 10, "Are all of the outputs stuck?" That is, "Do all the output nodes always remain in the same state, regardless of the fact that the input nodes are stimulated?" The tester answers the question by determining if any of the output nodes exhibit any activity during application of stimuli to the input nodes. There are many ways to make such a determination, as will be obvious to anyone of ordinary skill in the art. If none of the output nodes change their states in response to programmed stimuli at the input nodes, the tester does not check the connections between the input pins and the input nodes. However, if even one of the output nodes changes its state, then the tester moves to the next step in determining if the connection between the input pins and input nodes should be tested.

Referring now to step 12, the tester determines if each output node exhibits a repeatable signature, i.e., activity repeated identically, in response to a given set of stimuli repeated at the input nodes. Therefore, the tester applies a first programmed stimulus to the nodes of the circuit, and records the response at each node, i.e. records the signature. The programmed stimulus may be any stimulus. In the preferred method of the present invention, the programmed stimulus is a burst of Gray code stimuli.

The tester then repeats this process and for each output node compares the signatures. If for each output node the two signatures are identical, then the signatures are "repeatable". Referring now to step 46, if the signature at each output node is not repeatable, then the tester generates a report to the effect that the output pins associated with the component being tested are not open (i.e., the connections between the output pins and the output nodes are not open), and that the connections between the input nodes and the input pins of the component cannot be checked.

If the signatures at each output node are repeatable, this means that it is possible to isolate possibly open connections between the input pins and their corresponding input nodes. Referringnow to Step 16, a second programmed stimulus is chosen and is applied to all the input nodes. Then, for *each* input pin, the tester tests for an electrically open connection between the input pin and its corresponding input node as follows in Steps 18-36.

Referring now to Step 18, a "not open" flag is reset. That is, if the flag had been previously set that setting is nullified. Referring now to Step 20, while applying a logic low to a selected input node the tester applies the second programmed stimulus, e.g. a burst of Gray code stimuli, to the rest of the input nodes. Referring now to Step 22 of FIG. 1, the tester then compares the response (i.e., the signature) at each output node with the response when the second programmed stimulus is applied to *all* the input nodes. The second stimulus can, of course, be applied to all the input nodes either before or after Step 20. If the output signature at each output node is not identical to the output signature when the second stimulus is applied to *all* the input nodes, then the tester sets a "not open" flag (Step 24).

If the signatures are identical, then, as shown in Step 26 of FIG. 1, the tester applies a logic high to the selected input node while at the same time applying the second programmed stimulus to the rest of the input nodes, thus generating a signature at each output node. Referring now to Step 28 in FIG. 1, the tester compares the signature at each output node with the signature at each output node when the second programmed stimulus is applied to *all* the input nodes, and sets the "not open" flag if the signatures are not identical (Step 30).

Referring now to Step 32, if the "not-open" flag has not been set, then the tester generates a signal indicating a report that the tested pin-node connection might be open (Step 34). As indicated by Step 36 in FIG. 1, the method of Steps 18-34 is repeated for every input pin of the component.

Referring now to Step 40 in FIG. 1, if all the output nodes are unresponsive to changes in programmed stimuli at the input nodes, the tester measures the impedance at each output node. If the tester measures a high impedance at a given output node (Step 42) then the tester generates a signal indicating a report that the pin-node connection at the node tested is probably open, and that the tester cannot check the input nodes (Step 44). If a high impedance is not measured, then the tester generates an output signal indicating that the pin-node connection at the corresponding node is not open, and that the tester cannot check the input nodes (Step 46).

The principles and preferred method of the present invention have been described in the foregoing specification. The invention is not to be construed as limited to the particular method disclosed, since this is regarded as illustrative rather than restrictive. Moreover, variations and changes may be made by those skilled in the art without departing from the spirit of the invention.

What is claimed is:

1. For a circuit having nodes and having at least one component having pins, the pins physically connected to the nodes, the pins including input pins and output pins, the input pins connected to corresponding input nodes, the output pins connected to corresponding output nodes, a method of testing the connections between the pins and their corresponding nodes, comprising the steps of:

(a) determining if the connections between the input pins and the input nodes can be tested, said determining comprising the steps of:
 (i) determining if the output nodes exhibit activity in response to application of stimuli to the input nodes;
 (ii) continuing testing if any of the output nodes exhibit activity in response to application of stimuli to the input nodes;
 (iii) determining if each output node exhibits a signature repeated identically in response to stimuli repeated identically at the input nodes;
 (iv) continuing testing if each output node exhibits a signature repeated identically in response to stimuli repeated identically at the input nodes; and (b) testing for an electrically open connection between each input pin and its corresponding input node comprising the steps of:
 (i) applying a first stimulus to a selected input node while applying a second stimulus to the rest of the input nodes; and
 (ii) generating a signal indicating a possibly open connection if for every output node the response is identical to the response when the second stimulus is applied to all the input nodes.

2. The method of claim 1 further comprising when none of the output nodes exhibit activity in response to application of stimuli to the input nodes the step of generating an output signal indicating that the impedances of the output nodes should be measured.

3. The method of claim 1 further comprising the step of when at least one output node does not exhibit a signature repeated identically in response to stimuli repeated identically at all the input nodes, generating an output signal indicating that the connections between the output pins and the output nodes are not electrically open.

4. For a circuit having nodes and having at least one component having pins, the pins physically connected to the nodes, the pins including input pins and output pins, the input pins connected to corresponding input nodes, the output pins connected to corresponding output nodes, a method of testing the connections between the pins and their corresponding nodes, comprising the steps of:

(a) determining if the connections between the input pins and the input nodes can be tested, said determining comprising the steps of:
 (i) applying a first programmed stimulus to the input nodes;
 (ii) at each output node, measuring a response;
 (iii) continuing the testing if at least one response exhibited activity;
 (iv) applying a second programmed stimulus to the input nodes and measuring a first signature at each output node;
 (v) reapplying the second programmed stimulus to the input nodes and measuring a second signature at each output node;
 (vi) for each output node, comparing the first and second signatures; and
 (vii) continuing testing if the first and second signatures are identical; and (b) for each input pin, testing for an electrically open connection between a selected input pin and a corresponding selected input node, comprising the steps of:
  (i) while applying a logic low to said corresponding selected input node, applying a third programmed stimulus to the rest of the input nodes;
  (ii) measuring a third signature at each output node;
  (iii) applying the third programmed stimulus to the input nodes, and measuring a fourth signature at each output node;
  (iv) setting a not-open flag if for an output node the third signature is not identical to the fourth signature;
  (v) while applying a logic high to said corresponding selected input node, applying the third programmed stimulus to the rest of the input nodes;
  (vi) measuring a fifth signature at each output node;
  (vii) setting a not-open flag if for an output node the fourth signature is not identical to the fifth signature; and
  (viii) generating an output signal indicating possibly-open if the not-open flag has not been set.

5. For a circuit having nodes and having at least one component having pins, the pins physically connected to the nodes, the pins including input pins and output pins, the input pins connected to corresponding input nodes, the output pins connected to corresponding output nodes, a method of testing the connections between the pins and their corresponding nodes, comprising the steps of:
  (a) determining if the connections between the input pins and the input nodes can be tested, said determining comprising the steps of:
    (i) applying a first programmed stimuus to the input nodes;
    (ii) at each output node, measuring a response;
    (iii) continuing the testing if at least one response exhibited activity;
    (iv) applying a second programmed stimulus to the input nodes and measuring a first signature at each output node;
    (v) reapplying the second programmed stimulus to the input nodes and measuring a second signature at each output node;
    (vi) for each output node, comparing the first and second signatures; and
    (vii) continuing testing if the first and second signatures are identical; and
  (b) for each input pin, testing for an electrically open connection between a selected input pin and a corresponding selected input node, comprising the steps of:
    (i) applying a third programmed stimulus to the input nodes, and measuring a third signature at each output node;
    (ii) while applying a logic low to said corresponding selected input node, applying the third programmed stimulus to the rest of the input nodes;
    (iii) measuring a fourth signature at each output node;
    (iv) setting a not-open flag if for an output node the third signature is not identical to the fourth signature;
    (v) while applying a logic high to said corresponding selected input node, applying the third programmed stimulus to the rest of the input nodes;
    (vi) measuring a fifth signature at each output node;
    (vii) setting a not-open flag if for an output node the fourth signature is not identical to the fifth signature; and
    (viii) generating an output signal indicating possibly-open if the not-open flag has not been set.

6. The method of claim 5 whereinthe second and third programmed stimuli are identical to the first programmed stimulus.

7. The method of claim 6 wherein the first programmed stimulus is a burst of Gray code.

8. The method of claim 5 wherein the component is a surface-mounted component.

9. The method of claim 6 wherein the component is a surface-mounted component.

10. The method of claim 7 wherein the component is a surface-mounted component.

11. The method of claim 5 wherein the component is an integrated circuit.

12. The method of claim 6 wherein the component is an integrated circuit.

13. The method of claim 7 wherein the component is an integrated circuit.

* * * * *